United States Patent
Lee

(10) Patent No.: US 10,862,271 B2
(45) Date of Patent: Dec. 8, 2020

(54) HIGH-EFFICIENCY OXIDE VCSEL WITH IMPROVED LIGHT EXTRACTION, AND MANUFACTURING METHOD THEREOF

(71) Applicant: AUK CORP., Iksan-si (KR)

(72) Inventor: Hyung Joo Lee, Gwangju (KR)

(73) Assignee: AUK CORP., Iksan-si (KR)

( * ) Notice: Subject to any disclaimer, the term of this patent is extended or adjusted under 35 U.S.C. 154(b) by 0 days.

(21) Appl. No.: 16/393,949

(22) Filed: Apr. 24, 2019

(65) Prior Publication Data
US 2020/0059072 A1 Feb. 20, 2020

(30) Foreign Application Priority Data
Aug. 20, 2018 (KR) .................. 10-2018-0096731

(51) Int. Cl.
*H01S 5/00* (2006.01)
*H01S 5/183* (2006.01)
*H01S 5/343* (2006.01)

(52) U.S. Cl.
CPC ...... *H01S 5/18308* (2013.01); *H01S 5/18386* (2013.01); *H01S 5/18394* (2013.01); *H01S 5/34353* (2013.01); *H01S 5/34313* (2013.01); *H01S 2304/04* (2013.01)

(58) Field of Classification Search
CPC ............. H01S 5/18308; H01S 5/18386; H01S 5/18394; H01S 5/34353; H01S 5/34313
See application file for complete search history.

(56) References Cited

U.S. PATENT DOCUMENTS

| 6,515,308 | B1 * | 2/2003 | Kneissl et al. | ...... H01S 5/18341 257/104 |
| 10,601,201 | B1 * | 3/2020 | Sirbu | .................. H01S 5/18375 |
| 2003/0134448 | A1 * | 7/2003 | Ju | ........................ H01S 5/18308 438/47 |
| 2007/0001186 | A1 * | 1/2007 | Murai | ..................... H01L 33/22 257/98 |
| 2009/0003401 | A1 * | 1/2009 | Sekiguchi | ........... H01S 5/18305 372/50.124 |
| 2014/0079085 | A1 * | 3/2014 | Song | ................... H01S 5/18366 372/45.01 |
| 2018/0226771 | A1 * | 8/2018 | Tazawa | ................. H01S 5/3407 |
| 2020/0059071 | A1 * | 2/2020 | Lee | ..................... H01S 5/32308 |

FOREIGN PATENT DOCUMENTS

| JP | 2011-77496 | 4/2011 |
| KR | 20060033121 | 9/2010 |
| KR | 20060032049 | 2/2011 |

* cited by examiner

*Primary Examiner* — Kinam Park

(74) *Attorney, Agent, or Firm* — Honigman LLP

(57) ABSTRACT

The present invention relates to a vertical cavity surface emitting laser (VCSEL) and a manufacturing method thereof, and more specifically, to a high-efficiency oxide VCSEL which emits laser beams having a peak wavelength of 860 nm, and a manufacturing method thereof.

14 Claims, 9 Drawing Sheets

[Fig.1]
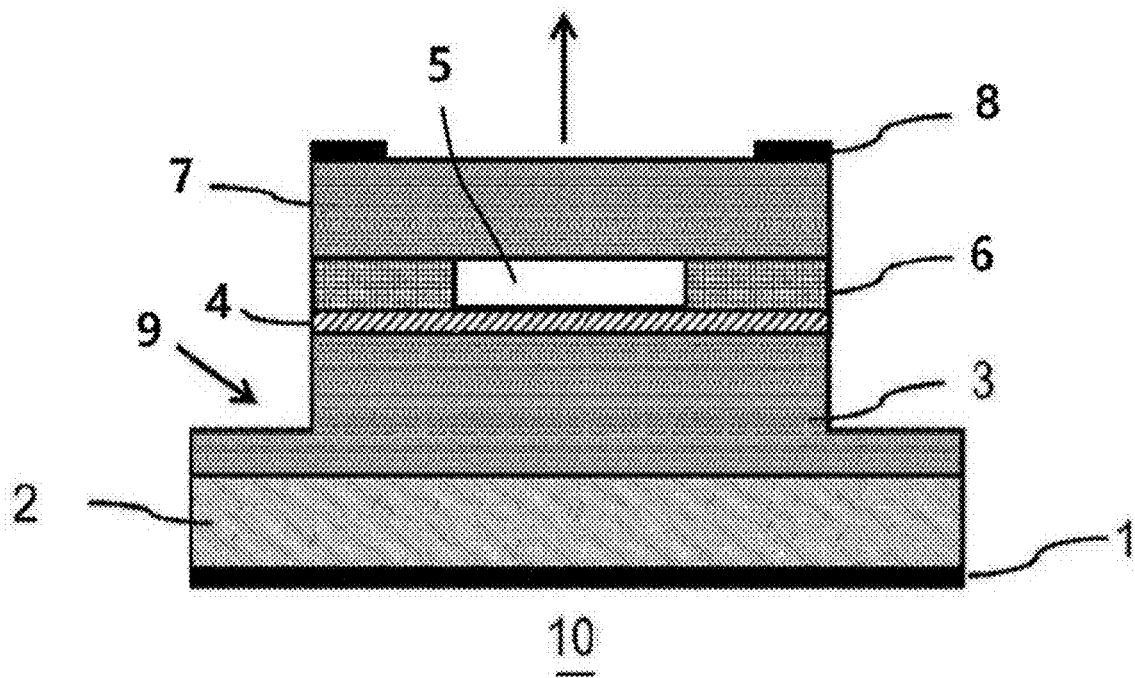
[Fig.2]
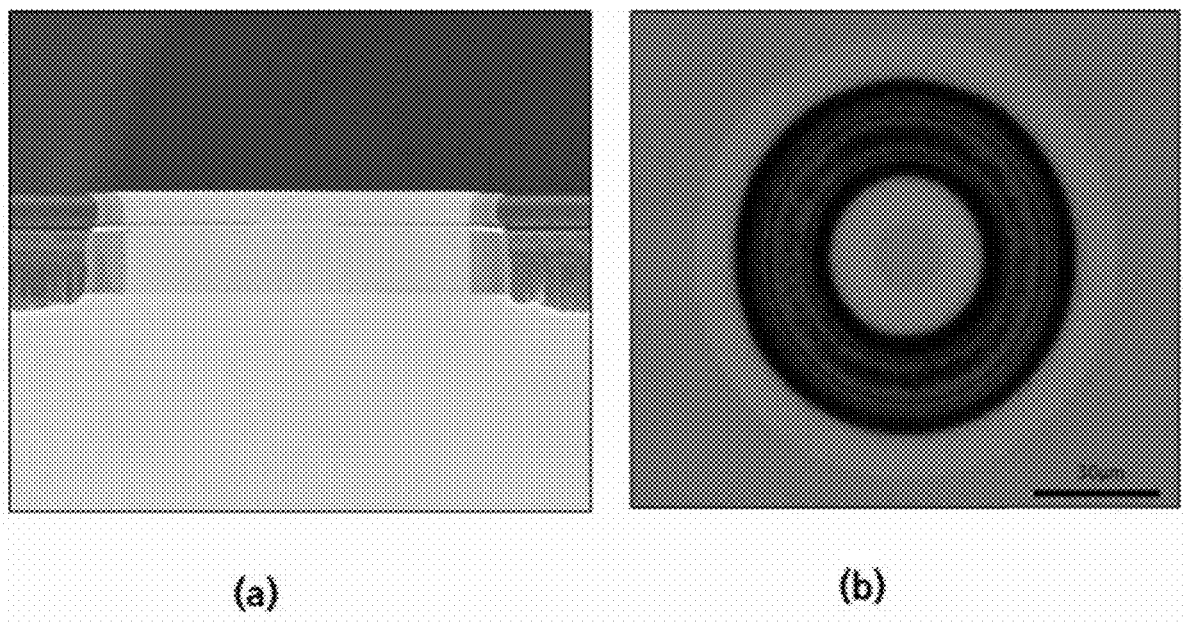
(a)　　　　　　　　　　　　(b)

[Fig.3]
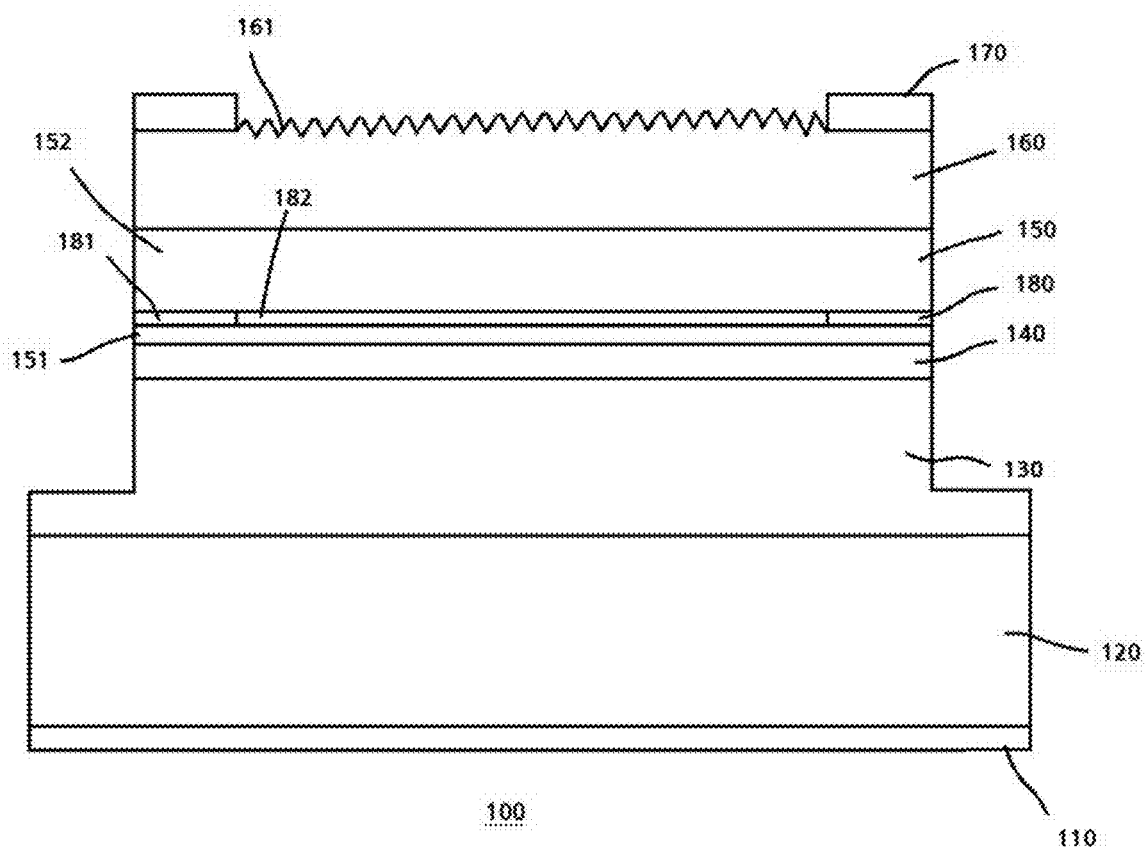

[Fig.4]
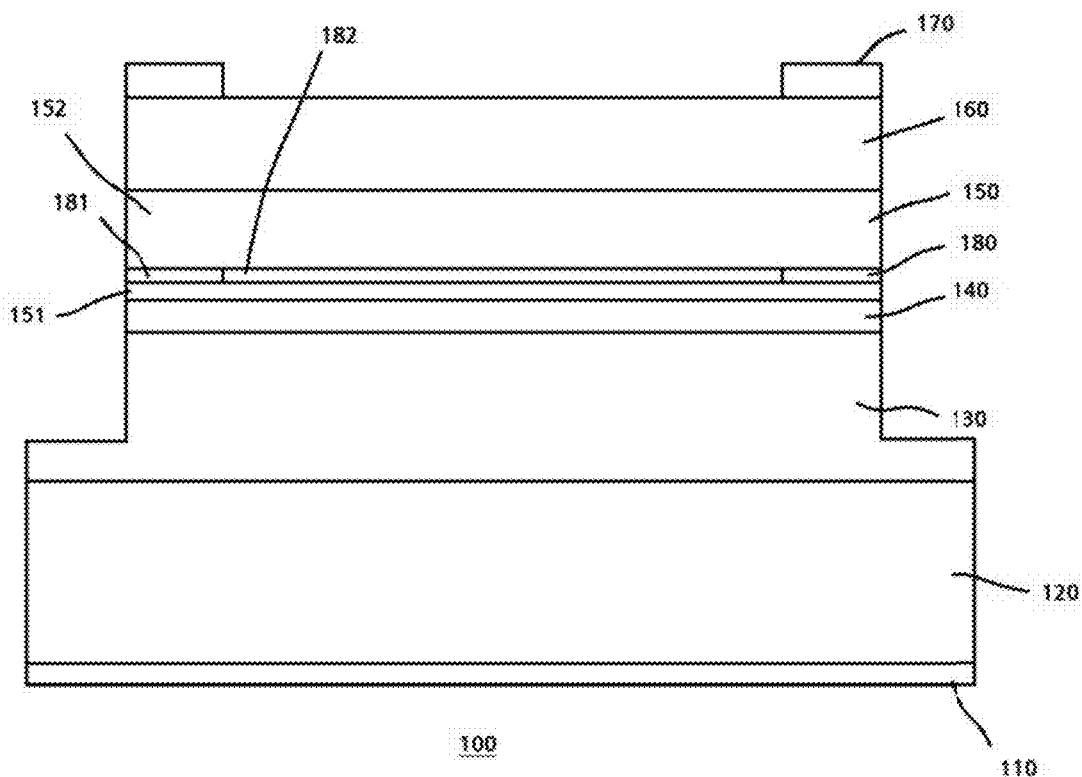

[Fig.5]
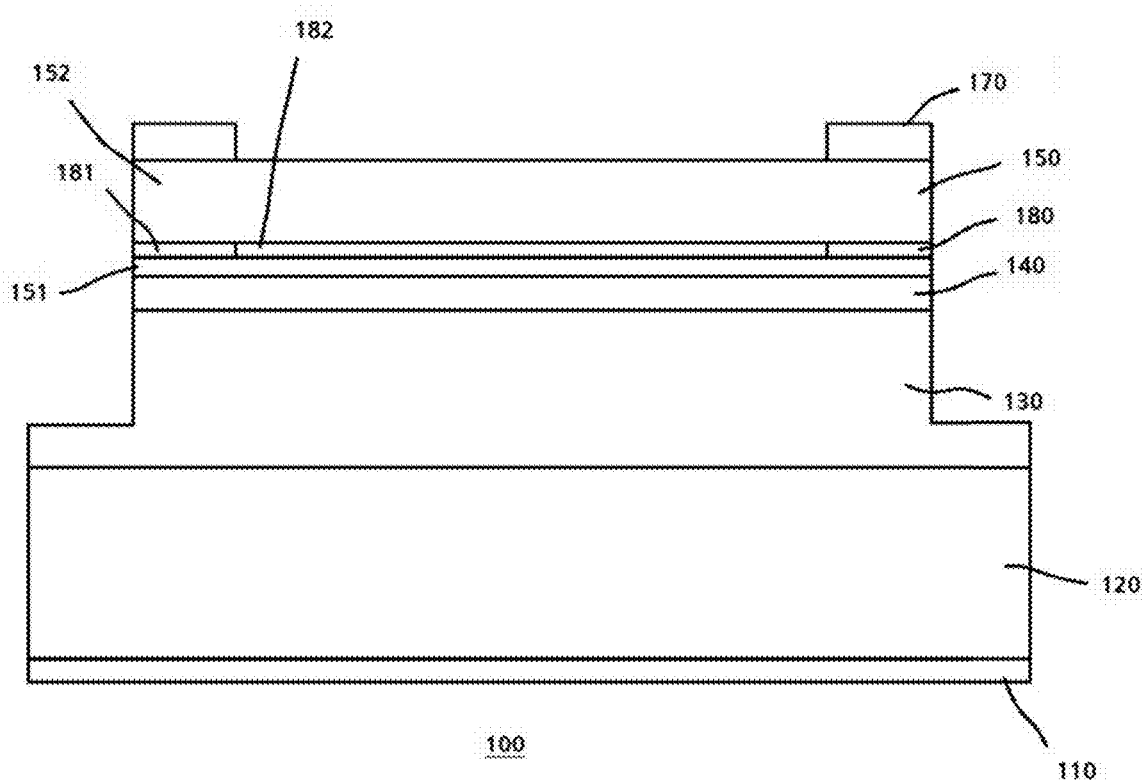

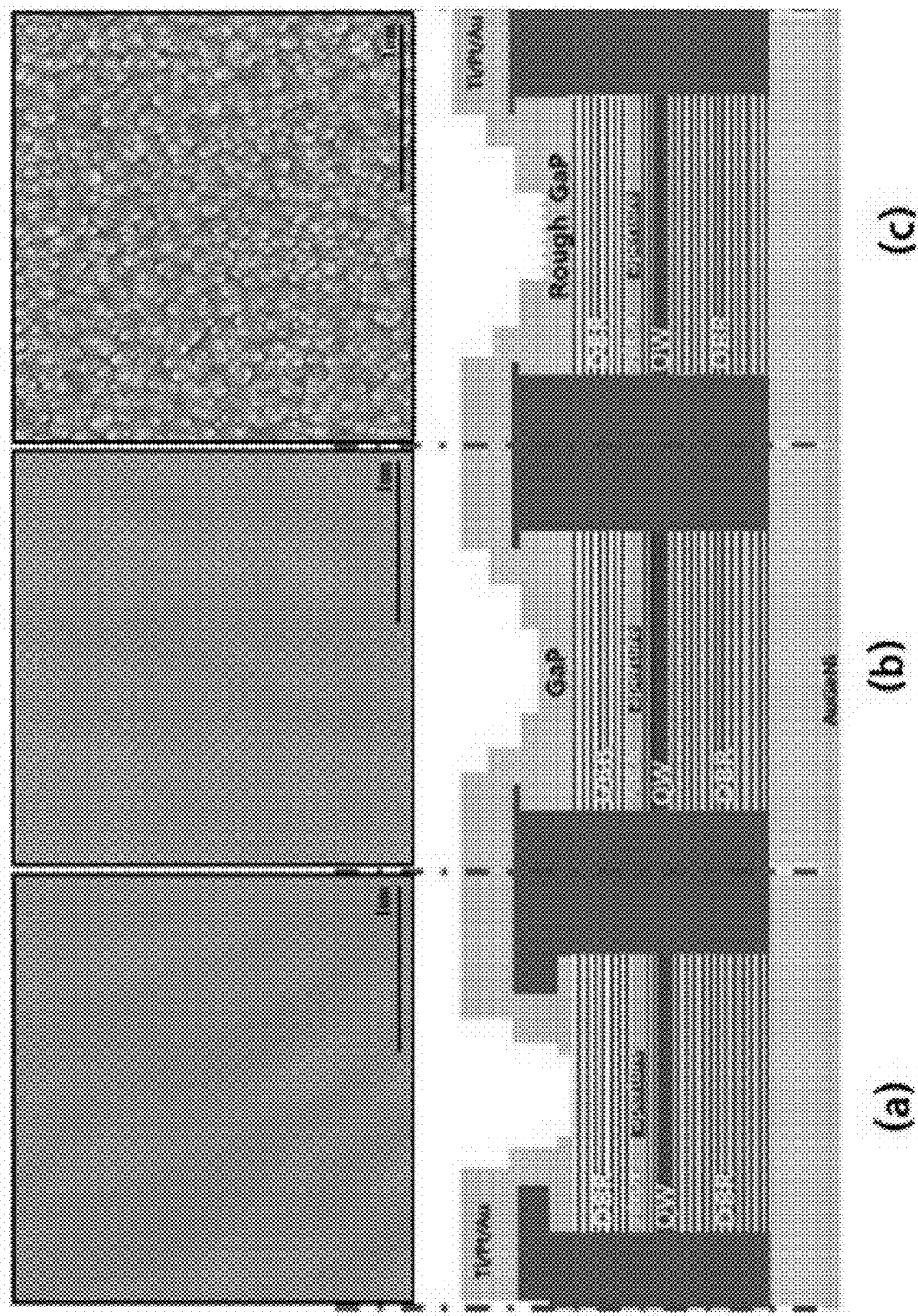
[Fig.6]

[Fig.7]
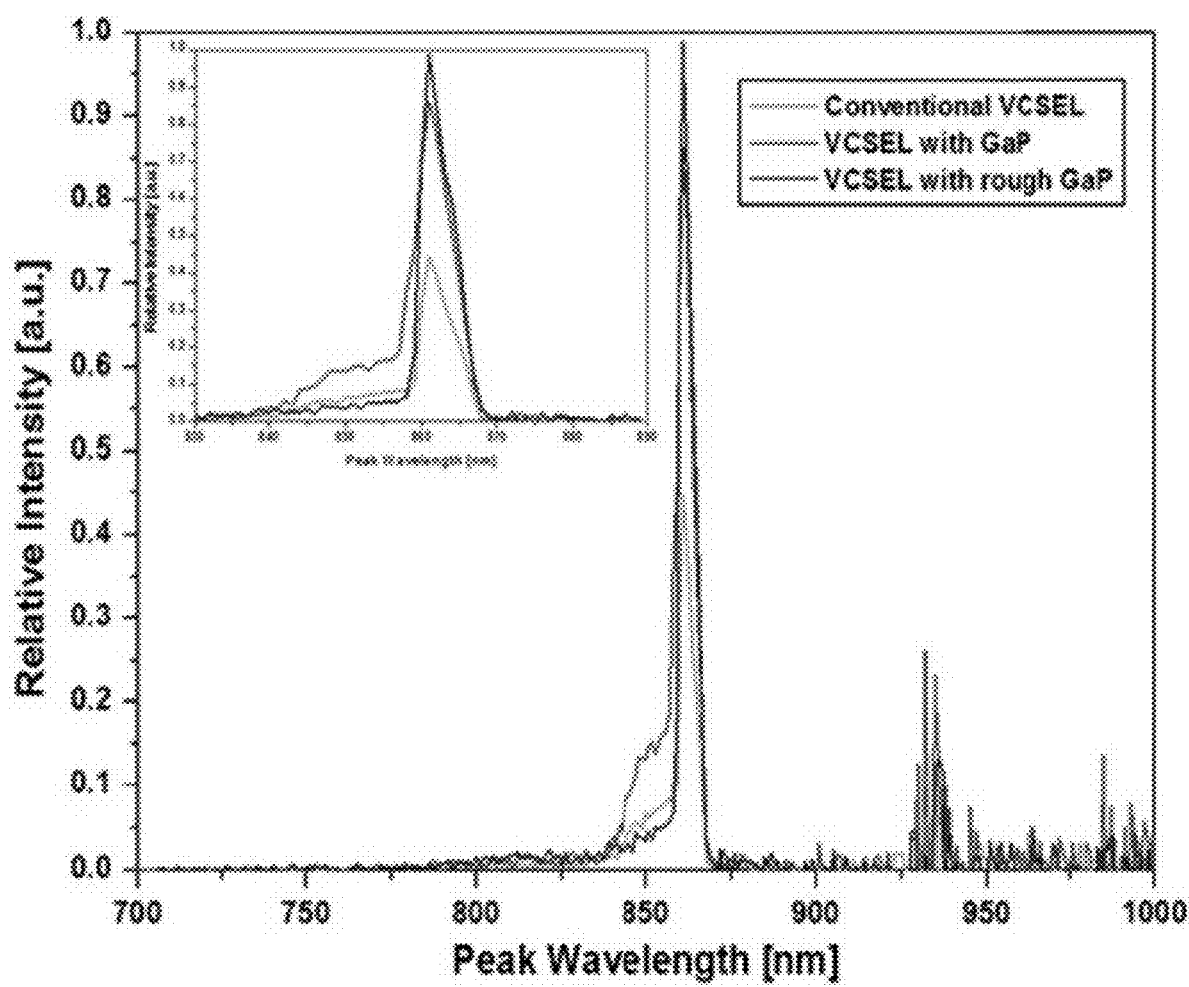

[Fig.8]
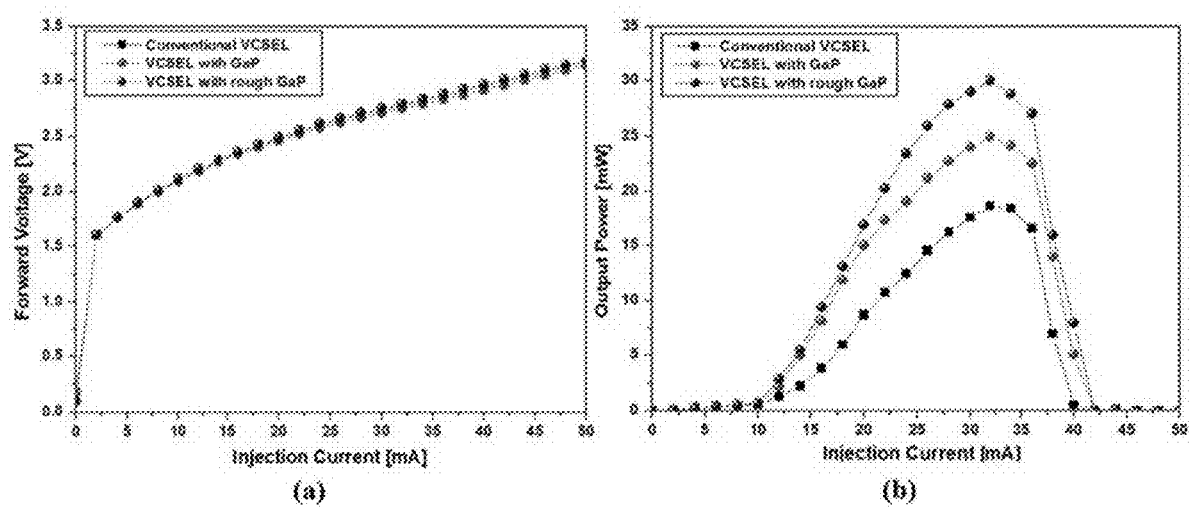

[Fig.9]
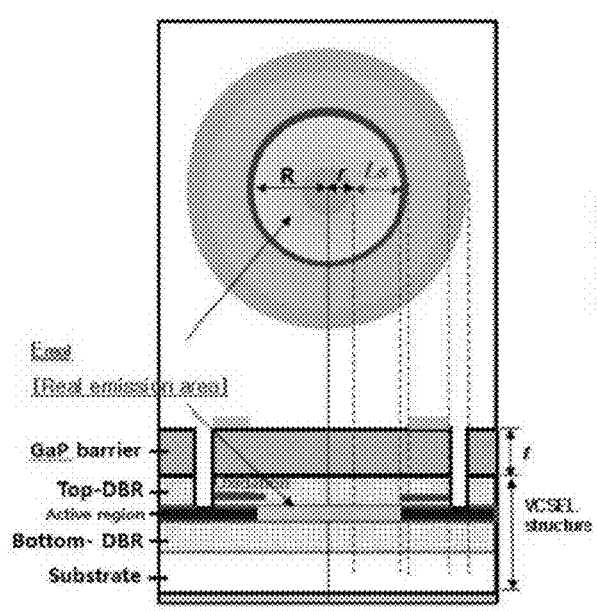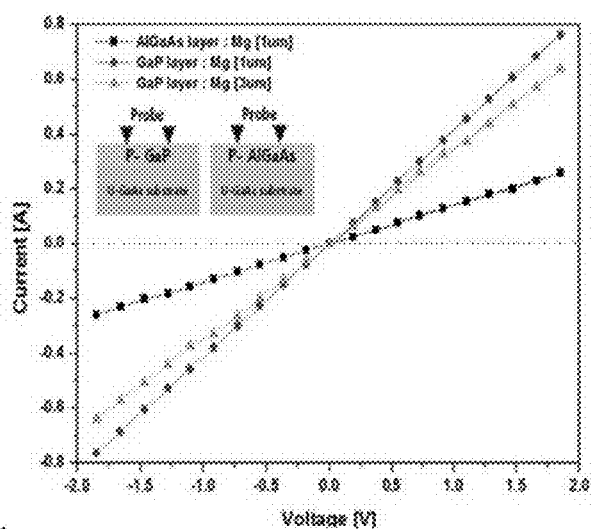
$$E_{real} = \pi(Ls+r)^2 - \pi r^2 = \pi(Ls^2 + 2rLs) \ [Ls \leq R]$$
$$Ls = \sqrt{\frac{tn_{ideal}kT}{\rho J_o e}} \qquad E_{real} = \pi\left(\frac{tn_{ideal}kT}{\rho J_o e} + 2r\sqrt{\frac{tn_{ideal}kT}{\rho J_o e}}\right)$$

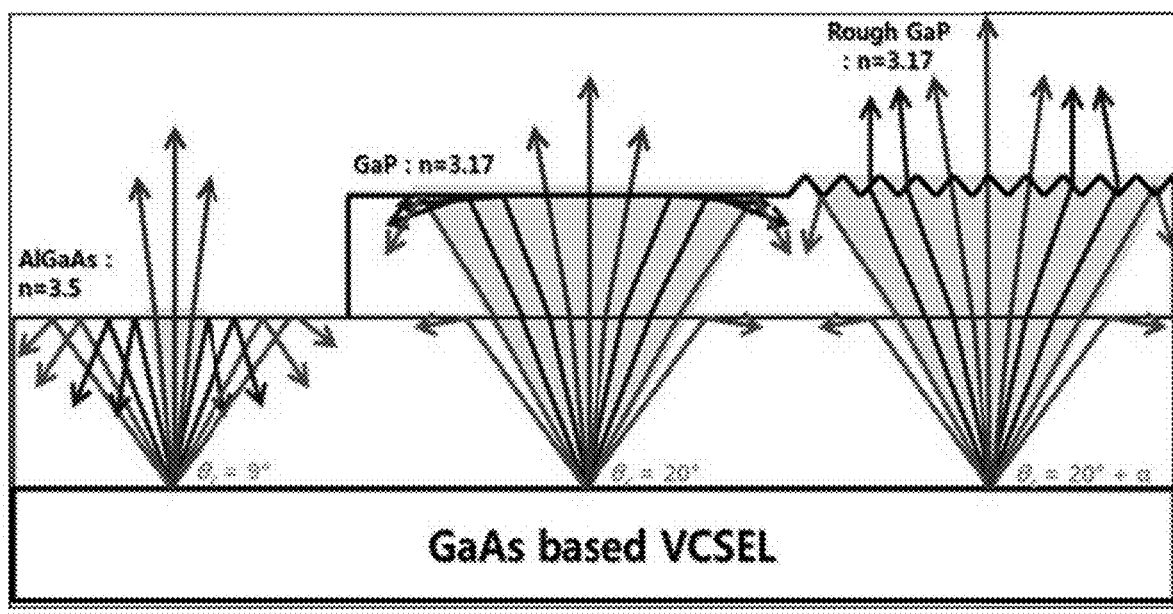
[Fig.10]

HIGH-EFFICIENCY OXIDE VCSEL WITH IMPROVED LIGHT EXTRACTION, AND MANUFACTURING METHOD THEREOF

PRIORITY CLAIM

This application claims the benefit of Korean Application No. KR 10-2018-0096731, filed on Aug. 20, 2018, which is incorporated by reference in its entirety.

BACKGROUND OF THE INVENTION

Field of the Invention

The present invention relates to a vertical cavity surface emitting laser (VCSEL) and a manufacturing method thereof, and more specifically, to a high-efficiency oxide VCSEL with improved light extraction, which emits a large amount of laser having a peak wavelength of 860 nm, and a manufacturing method thereof.

Background of the Related Art

Although the efficiency of a general vertical cavity surface emitting laser (VCSEL) is lower than that of an existing edge emitting laser, since laser is emitted in the vertical direction, the VCSEL can be used in the region of an existing light emitting diode and thus has high marketability.

As shown in FIG. 1, the VCSEL 10 like this has a structure of stacking a bottom electrode 1, a substrate 2, a bottom distributed Bragg reflector 3, an active layer 4, a current window 5 for emitting cavity laser beams, an oxidized layer 6 formed to surround the current window, a top distributed Bragg reflector 7 formed on the top surface of the current window 5 and the oxidized layer 6, and a top electrode 8. A trench 9 is formed, and the laser beams are emitted upward.

Generally, the trench 9 is a circular trench formed using a dry etching technique. The oxidized layer 6 is formed as the periphery of the current window 5 is oxidized by an oxidant injected through the trench 9 and adjusts the diameter of the unoxidized remaining current window 5 by controlling the oxidation time. In addition, the top and bottom DBRs are applied to the top and the bottom of the active layer through an epitaxial process. In the case of a VCSEL which emits light of 800 to 1,000 nm, a DBR of a stack structure configured of $Al_xGa_{1-x}As/Al_yGa_{1-y}As$, where $0.8<x<1$ and $0<y<0.2$, is generally used.

Accordingly, the current window (oxide aperture) and the top and bottom DBRs are essential in the manufacturing process for the characteristic of the cavity laser, and the problem is that since the materials used in these two components are materials of the same kind, the probability of generating a defect is high as the uppermost part of the top p-DBR is oxidized together with the current window in the oxidation process for forming the current window. The oxidation process is a process of manufacturing an AlxOy layer by injecting $H_2O$ steam and reacting Al of an $Al_{0.93}Ga_{0.02}As$ layer used as the current window using high temperature steam, and since the top and bottom DBRs made of AlxGa1-xAs/AlyGa1-yAs contain Al, they are oxidized together to some extent.

FIG. 2(a) shows an SEM image of a DBR damaged when oxidation is progressed, and when a p-metal is applied to a damaged DBR sample, electrode peeling or uneven current injection (reduction of efficiency) may be generated later. FIG. 2(b) shows a current window shape, and the black stripe is a trench (pitted) area, and the area in the middle is a pillar area for emitting light, in which the brighter area is an oxidized area. The dark circular area at the center is the light emitting area directly emitting light and is marked as an aperture diameter in the VCSEL.

Since the elements of a conventional VCSEL generate much heat when high current is applied by the nature of resonance and the elements are damaged frequently as high current is applied, low current is injected, arid thus the current spreading effect cannot be expected much from the current injected from the electrode. Therefore, since the current emitted from the top electrode positioned along the edge of the top DBR does not evenly pass through the current window at the center, there is a problem of lowering the efficiency.

Korean Laid-opened Patent No. 10-2018-0015630 (WO 2016/198282) discloses an oxide VCSEL having a peak wavelength of 850 nm and a method of diversely forming a plurality of oxidized layers inside the top DBR to improve the oxide VCSEL. This manufacturing process primarily generates uneven top DBR reflectivity and also causes a complicated problem in oxidation reprocess or the like for creating several current windows.

Meanwhile, as a measure for evenly passing the current emitted from the top electrode through the current window at the center, a transparent ITO layer is formed all over the top DBR to evenly supply the current emitted from the electrode of a ring shape to the center through the ITO. However, in this case, an expensive transparent electrode is required, and it is difficult to avoid abrupt reduction of throughput in the process of forming the ITO.

Furthermore, the oxide VCSEL is disadvantageous in that the generated cavity wavelength has some local light emitting areas, and light extraction efficiency is also lowered due to the top DBR positioned at the uppermost part.

SUMMARY OF THE INVENTION

Therefore, the present invention has been made in view of the above problems, and it is an object of the present invention to provide a method of preventing damage of a top DBR in the process of manufacturing an oxide VCSEL.

Another object of the present invention is to provide a method of manufacturing an oxide VCSEL by inducing stable flow and spread of electricity from a top electrode of a VCSEL to a light emitting area.

Another object of the present invention is to provide a high conductivity barrier layer, which can prevent damage of a top DBR in an oxidization process of an oxide VCSEL, induce stable flow and spread of electricity from a top electrode to a light emitting area, and is transparent to the light emitted from the oxide VCSEL.

Another object of the present invention is to provide a thickness of a high conductivity barrier layer, appropriate to prevent damage of a top DBR in an oxidization process of an oxide VCSEL, to induce stable flow and spread of electricity from a top electrode to a light emitting area, and to be transparent to the light emitted from the oxide VCSEL, by covering the top DBR so that efficiency of the VCSEL can be enhanced remarkably.

Another object of the present invention is to provide a technique of activating a local light emitting area to the maximum and more effectively extracting light emitted from the light emitting area to the outside to enhance efficiency of the VCSEL.

To accomplish the above objects, according to one aspect of the present invention, there is provided an oxide vertical cavity surface emitting laser (VCSEL) having a conductive current spreading layer formed between a top electrode and a top distributed Bragg reflector, wherein the conductive current spreading layer passes a laser having a peak wavelength of 860+10 nm (hereinafter, referred to as a '860 nm peak wavelength'), has a refractive index lower than that of the top distributed Bragg reflector, and has a rough top surface.

Although it is not theoretically limited, a non-rough current spreading layer improves flow of current supplied from a top electrode to a current window, and although flow of the supplied current is improved as the thickness increases, if the non-roughed current spreading layer becomes as thick as to provide sufficient current flow, the effect of improving the current flow is not expected any more. However, since a rough current spreading layer prevents the problem of total reflection of generated laser light from the surface into the layer and not being extracted on the basis of sufficient current flow, it may overcome the limit of improving the non-rough current spreading layer.

In the present invention, it is understood that a laser means a wavelength having a full-width at half-maximum (FHWM) of 5 nm or smaller.

In the present invention, the current spreading layer is preferably a non-oxidizing barrier layer to prevent damage of a top DBR by covering the top DBR in an oxidization process of the VCSEL.

In an embodiment of the present invention, the current spreading layer may be an Al-free layer that does not include an Al component to prevent oxidization by steam, further preferably, a conductive GaP layer having relatively high transparency with respect to a laser having a peak wavelength of 860 nm and having a rough surface formed on the top surface so as to enhance efficiency of the oxide VCSEL in the stacking process.

In the present invention, the rough surface of the top surface of the GaP layer may be manufactured by etching the top surface of the GaP layer. The etching may be wet etching or dry etching, and roughness of the etched surface may be $>\pm 1$ µ.

In an embodiment of the present invention, the wet etching for the rough surface of the GaP layer may be accomplished using an acid series mixture such as hydrochloric acid, sulfuric acid or the like, and the dry etching may be processed by etching equipment using a mixed gas of a BCl series gas, Ar gas and the like and plasma applied with RF power.

In the present invention, the GaP layer having a rough top surface may include a metallic or non-metallic dopant to improve conductivity. An example of the metallic dopant is magnesium (Mg) or zinc (Zn), and the non-metallic dopant may be carbon.

In the present invention, the GaP layer having a rough top surface preferably has a thickness of 1 µm or larger so that the current may sufficiently spread. If the thickness is small, spread of the current is insufficient, and improvement in the efficiency of the oxide VCSEL according to adoption of the current spreading layer is small.

In the present invention, it is preferable to increase the thickness of the current spreading layer as much as a thickness that does not have an effect of improving efficiency according to increase of thickness because of saturation (saturation thickness). In an embodiment of the present invention, when the VCSEL has a current window of a 10 µm diameter, the saturation thickness may be 3 µm.

In the present invention, an oxide vertical cavity surface emitting laser (VCSEL) may include a bottom electrode, a substrate, a bottom distributed Bragg reflector, an active layer, a top distributed Bragg reflector, a top electrode and an oxidized layer.

In the present invention, the active layer of the VCSEL can be an active layer which can emit light having a peak wavelength of 850+10 nm (hereinafter, referred to as a 850 nm peak wavelength). In an embodiment of the present invention, the active layer may include a GaAs quantum well and an AlGaAs quantum barrier layer.

In the present invention, the top distributed Bragg reflector and the bottom distributed Bragg reflector are used to reflect up and down the light emitted from the active layer so that the light may resonate.

In the present invention, the top and bottom DBRs may be DBRs repeatedly stacking reflective layers configured of a pair of a high refractive layer and a low refractive layer to reflect the light emitted from the active layer and the light reflected by an opposing reflector.

In an embodiment of the present invention, thirty or more pairs, preferably forty pairs of n-DBRs, may be used in the bottom DBR to almost perfectly reflect the light reflected by the top DBR, and the top DBR may have p-DBRs, five to ten pairs less than the n-DBRs of the bottom DBR, preferably twenty to twenty-five pairs of p-DBRs, to enhance the possibility of emitting light.

In an embodiment of the present invention, the top distributed Bragg reflector and the bottom distributed Bragg reflector may be distributed Bragg reflectors (DBRs) having a structure repeatedly stacking an $Al_xGa_{1-x}As$ layer of $0.8<x<1$ and an $Al_yGa_{1-y}As$ layer of $0<y<0$.

In the present invention, the oxidized layer is configured of an oxidizing material and may mean a layer in which an oxidized area and a non-oxidized area commonly exist for resonance. The oxidized layer may be $Al_zGa_{1-z}As$ of $0.95<z\leq 1$ to be easily oxidized by high temperature steam. The oxidized layer is oxidized from the outer part toward the center, and thus, may be configured of an oxidized layer of a ring shape and a non-oxidized layer of center circle, which may become a current window. In the present invention, the diameter of the center circle configuring the current window in the oxidized layer should be as narrow as to be able to emit laser beams and may be 10 µm or smaller preferably.

In the present invention, the oxidized layer may be positioned on the top of the active layer and preferably positioned inside the top p-DBR, preferably between layers configuring the p-DBR, not to affect the active layer. Further preferably, the oxidized layer may be positioned on the bottom of the top p-DBR, e.g., between a first pair and a second pair in the top DBR, and may be applied at a thickness of 30 to 100 nm.

In an embodiment of the present invention, the oxide VCSEL may operate at a current of 10 to 40 mA, preferably in a range of 25 to 35 mA, and most preferably in a range of 30 to 35 mA. When the current is 10 mA or lower, laser beams are not generated, and when the current is 40 mA or higher, a laser beam having a peak wavelength of 860 nm is not generated due to the effect of heat generation.

In the present invention, the top electrode may be configured in a ring shape not to block emitted light, and preferably, it may be a multilayer electrode configured of Au/Pt/Ti. In an embodiment, the electrode may be about 2 micrometers.

In the present invention, the oxide VCSEL may further include an anti-reflection layer to prevent reflection of emitted light. The anti-reflection layer may be positioned between the current spreading layer and the top electrode while covering the current spreading layer. In addition, the anti-reflection layer may be positioned at the uppermost part of the oxide VCSEL while covering the top electrode and the top of the anti-reflection layer.

In an embodiment of the present invention, the anti-reflection layer may be configured of SiN or SiO and applied to grow at a thickness of 100 to 500 nm. The anti-reflection layer is preferably 150 to 400 nm, further preferably 200 to 300 nm.

The present invention, there is provided a method of manufacturing an oxide VCSEL having a peak wavelength of 860 nm, in which a GaP layer having a thickness of 1 μm or larger is formed between a top electrode and a top DBR.

BRIEF DESCRIPTION OF THE DRAWINGS

FIG. 1 is a view showing an exploded cross-section of a conventional oxide VCSEL.

FIG. 2(a) is a view showing an SEM image of a DBR damaged when oxidation is progressed, and FIG. 2(b) is a view showing a shape of a current window, in which the black stripe is a trench (pitted) area, and the area in the middle is a pillar area for emitting light, and the brighter area is an oxidized area.

FIG. 3 is a cross sectional view showing an oxide VCSEL according to an embodiment of the present invention.

FIG. 4 is a cross sectional view showing an oxide VCSEL without a GaP layer according to comparative embodiment 1 compared to the present invention.

FIG. 5 is a cross sectional view showing an oxide VCSEL having a non-rough GaP layer according to comparative embodiment 2 compared to the present invention.

FIG. 6 is a view comparing the structures and top surfaces of a rough GaP layer of an embodiment of the present invention, a state without a GaP layer of comparative embodiment 1, and a non-rough GaP layer of comparative embodiment 2.

FIG. 7 is a view comparing light intensity of a rough GaP layer of an embodiment of the present invention, a state without a GaP layer of comparative embodiment 1, and a non-rough GaP layer of comparative embodiment 2 at a current of 20 mA.

FIG. 8 is a view comparing light intensity of a rough GaP layer of an embodiment of the present invention, a state without a GaP layer of comparative embodiment 1, and a non-rough GaP layer of comparative embodiment 2 at a current in a range of 0 to 50 mA.

FIG. 9 is a view showing the factors related to intensity of light generated by a VCSEL.

FIG. 10 is a view describing light reflectivity of a rough GaP layer of an embodiment of the present invention, a state without a GaP layer of comparative embodiment 1, and a non-rough GaP layer of comparative embodiment 2.

DESCRIPTION OF SYMBOLS

| | |
|---|---|
| 100: Oxide VCSEL | 110: Bottom electrode |
| 120: Substrate | 130: Bottom DBR |
| 140: Active layer | 150: Top DBR |
| 160: GaP layer | 170: Top electrode |
| 180: Oxidized layer | |

DETAILED DESCRIPTION OF THE PREFERRED EMBODIMENT

Hereafter, the present invention will be described in detail through embodiments. The embodiments described below are intended not to limit, but to illustrate the present invention.

Embodiment 1

FIG. 3 is a view showing a VCSEL layer structure for emitting a laser beam having a peak wavelength of 860 nm, in which a high conductive GaP barrier layer manufactured by a MOCVD system is applied. As shown in FIG. 3, an oxide VCSEL 100 having a peak wavelength or 860 nm, in which a high conductive GaP barrier layer according to the present invention is applied, is an oxide VCSEL 100 which emits laser beams toward the top of a substrate 120. The substrate 120 is an n-type GaAs substrate. A bottom electrode 110 is provided on the bottom of the substrate 120.

A bottom n-DBR 130, in which pairs of a high refractive index AlGaAs layer and a low refractive index AlGaAs layer are repeatedly stacked, is provided or the top of the substrate 120. An $Al_{0.85}Ga_{0.15}As$ layer and an $Al_{0.15}Ga_{0.85}As$ layer are repeatedly stacked as many as forty times.

An active layer 140 is provided on the bottom DBR 130. The active layer 140 includes a quantum well structure for generating light. The active layer 140 is a GaAs/AlSaAs active layer QW for emitting light having a center wavelength of 850 nm.

A top p-DBR 150 including an oxidized layer 180 is provided on the active layer 140. To avoid damage of the active layer in an oxidization process, the oxidized layer 180 may be inserted between layers of the pairs configuring the p-DBR 150 and may avoid direct contact with the active layer 140. The active layer 140 is stacked on a pair or two pairs of the top DBRs among the twenty pairs, and the other pairs of the top DBR are stacked on the oxidized layer 180.

Accordingly, the top DBR 150 is configured of a first top DBR 151 positioned on the bottom of the oxidized layer 180 and a second top DBR 152 positioned on the top of the oxidized layer 180.

In the same manner as the bottom n-DBR, pairs of a high refractive index AlGaAs layer and a low refractive index AlGaAs layer are repeatedly stacked in the top p-DBR 150, and the top p-DBR 150 is configured of twenty pairs of an $Al_{0.85}Ga_{0.15}As$ layer and an $Al_{0.15}Ga_{0.85}As$ layer.

The oxidized layer 180 is configured of a circular current window (oxidation aperture) 181 formed of $Al_{0.98}Ga_{0.02}As$ having a thickness of about 30 nm at the center and an oxidized ring 182 at the periphery that is formed as the current window is oxidized by steam. The DBR reflectivity shows an excellent characteristic of the stop-band shape at almost 98%.

A GaP layer 160 is grown on the top p-DBR 150 as much as 3 μm in the MOCVD method. A top electrode 170 is formed on the top GaP 160 in a ring shape.

A rough surface is formed at the center of the top electrode 170 through dry etching. As shown in FIG. 6(c), whether a rough surface is formed is confirmed by photographing the surface. The peak wavelength of the active layer 140 is about 850 nm, and the cavity peak is about 860 nm by the DBR reflection.

COMPARATIVE EXAMPLE 1

As shown in FIG. 4, in the embodiment 1, a top electrode 170 of a ring shape is formed on the top p-DBR 150 without a GaP layer 160. As shown in FIG. 6(a), the surface is photographed and compared.

COMPARATIVE EXAMPLE 2

As shown in FIG. 5, in the embodiment 1, the top electrode 170 of a ring shape is formed on the top p-DBR 150 without a GaP layer 160. As shown in FIG. 6(b), the surface is photographed and compared.

As shown in comparative example 1, it is confirmed that the surface of a conventional VCSEL without a GaP layer is very smooth, and also in the case of a VCSEL to which a GaP layer is applied as shown in comparative example 2, the surface is almost similar to that of the conventional VCSEL. When a rough GaP layer is applied as shown in embodiment 1, it is confirmed that very high roughness has been applied. Such a surface roughness is applied only to a local area through which light is actually emitted.

Performance Test 1

A 20 mA current is applied to a VCSEL without a GaP layer (comparative example 1), a VCSEL to which a non-rough GaP barrier having a thickness of 3 um is applied (comparative example 2), and a VCSEL having a rough GaP layer, and emission intensity is measured. Its result is shown in FIG. 6. In the case of comparative example 1 in which a GaP layer is not applied, an intensity of about 0.45 is shown, and in the case of comparative example 2 in which the GaP layer is applied, the intensity is about 0.86, which is an increase of intensity of about 80%. On the contrary, as shown in embodiment 1, it may be confirmed that when a rough GaP is applied, the intensity is about 99, which is an increase of intensity of about 110%.

These results show that although light efficiency of the VCSELs is enhanced owing to the current spreading effect when a GaP barrier is primarily applied, when surface roughness of the GaP barrier is applied, the light efficiency is enhanced much more as the light extraction efficiency of the light generated by the current spreading effect is enhanced.

Performance Test 2

FIG. 8 confirms (a) an I-V curve and (b) an I-L curve of VCSELs of comparative example 1, comparative example 2 and embodiment 1 by applying a current of 0 to 50 mA in the present invention.

Confirming the (a) I-V characteristic, the I-V characteristics of all the samples are the same without regard to application of a GaP barrier or a rough GaP barrier. This is since that conductivity of the GaP is relatively high compared with those of VCSEL materials.

Confirming the (b) I-B characteristic, a considerably enhanced light efficiency characteristic is confirmed according to application of the GaP barrier or the rough GaP barrier. Light efficiency of a general VCSEL is confirmed to be about 17 mW at about 33 mA, and when a GaP barrier is applied, light efficiency is about 24.5 mW, which is an increase of about 44%, and when a rough GaP barrier is applied, light efficiency is about 30 mW, which is an increase of about 76%.

Analysis of Results

FIG. 9 shows (a) a computational model for the current spreading effect of a VCSEL to which a high conductivity GaP layer is applied and (b) current flow curves when two probes contact on GaP and AlGaAs, respectively, which is a representative material of the GaP barrier and the VCSEL. In addition, it shows a final equation obtained from the computational model. It is confirmed through FIG. 8(a) that a real emission area of the active layer is limited by the current window, and in addition, it is known that the current spreading area Ls of the current injected from an electrode becomes maximum (Ls=R) when the current spreading area grows toward the further inner side as much as the r (non-current spreading area) value becomes 0, i.e., when the current spreading area becomes the same as the real emission area. These values are expressed as an equation shown on the bottom, and the most important variables in the equation are t (thickness of the GaP barrier) and ρ (nonresistance of the GaP barrier 1/conductivity). Therefore, it is understood that Ls (current spreading area) abruptly increases as t increases or ρ decreases as shown in the equation. Here, it is understood that, the current spreading area becomes the maximum value when Ls=R although t or ρ continuously increases by the nature of the VCSEL having an inner local light emitting area. The GaP material, which is used when the two probe contact current flow curve (b) is confirmed, shows a conductivity higher than that of AlGaAs, which is a representative material of the VCSEL, as much as four times or more, and it is understood that the GaP barrier, which is a high conductive material, may be used to be appropriate to the equation of FIG. 8.

FIG. 10 shows a result of light emitting paths of a general VCSEL (comparative example 1), a VCSEL to which a non-rough GaP barrier is applied (comparative example 2), and a VCSEL to which a rough GaP barrier is applied (embodiment 1). The light emitting path result shows that additional increase of light efficiency can be obtained only by performing surface treatment of the GaP barrier on the VCSEL that already has accomplished improvement of light efficiency through a current spreading layer by applying the GaP barrier. Further enhanced light extraction efficiency of a VCSEL can be obtained by roughly processing the surface of a GaP barrier existing in a local light emitting area of the VCSEL through a wet or dry etching process, and the light extraction efficiency may be regarded as being affected by decrease of total internal reflection (TIR) resulting from roughness of the surface. Additionally, when an anti-reflection layer of SiN, SiO or the like is applied on the top of a rough GaP, further higher light efficiency can be obtained.

According to the present invention, there is provided a new barrier, which is also a current spreading layer, capable of protecting a top DBR in an oxidization process, enhancing flow of current, and passing light of an 860 nm VCSEL.

The oxide VCSEL having a GaP barrier layer according to the present invention enhances light efficiency up to 40% by improving electrode protection and current flow of an 860 nm VCSEL having an oxidation aperture, and an optimum range of efficiency between the applied high conductive material and the oxidation aperture of the VCSEL can be confirmed.

According to the present invention, there is provided a method of enhancing light emission and extraction capability of an oxide VCSEL having low emission efficiency due to a narrow emission area and a top DBR.

Although the present invention has been illustrated and described in detail in the above drawings and descriptions, it is considered that the drawings and descriptions are illustrative or exemplary and not restrictive. Other changes may be apparent to those skilled in the art from the present invention. These changes may accompany other features that can be used instead of or in addition to the features publicized in this field or described in this specification.

Modifications of the disclosed embodiments may be understood and affected by those skilled in the art from learning of the drawings, the present invention and the appended claims. The term "comprising"used in the claims does not exclude other, elements or steps, and description of an indefinite article does not exclude a plurality of elements or steps. The fact that particular actions are cited in different dependent claims does not mean that these actions cannot be used to make combinations of the actions advantageous. Arbitrary reference symbols in the claims should not be interpreted as limiting the scope of the claims.

What is claimed is:

1. An oxide vertical cavity surface emitting laser (VCSEL) comprising a conductive current spreading layer formed between a top electrode and a top distributed Bragg reflector to pass laser beams having a peak wavelength of 860±10 nm, having a refractive index lower than that of the top distributed Bragg reflector, and having a rough top surface.

2. The VCSEL according to claim 1, wherein the current spreading layer is a GaP layer.

3. The VCSEL according to claim 2, wherein the GaP layer includes a metallic and/or non-metallic dopant.

4. The VCSEL according to claim 3, wherein one or more among a group including Mg, Zn and carbon are selected as the dopant.

5. The VCSEL according to claim 1, wherein the current spreading layer has a thickness of 1 μm or larger.

6. The VCSEL according to claim 1, wherein the rough layer is a wet or dry-etched rough layer.

7. The VCSEL according to claim 1, wherein roughness of the rough layer is $>\pm 1\mu$.

8. The VCSEL according to claim 1, wherein the oxide vertical cavity surface emitting laser includes a bottom electrode, a substrate, a bottom distributed Bragg reflector, an active layer, a top distributed Bragg reflector, a top electrode, and an oxidized layer.

9. The VCSEL according to claim 8, wherein the active layer is configured of a GaAs quantum well and an AlGaAs quantum barrier layer; the top and bottom DBRs are distributed Bragg reflectors having a structure repeatedly stacking two layers of an $Al_xGa_{1-x}As$ layer of $0.8<x<1$ and an $Al_yGa_{1-y}As$ layer of $0<y<0$; the oxidized layer is configured of an outer oxidized layer of a ring shape and an inner current window of a center circle shape; and the top electrode is an electrode of a ring shape.

10. The VCSEL according to claim 8, wherein the oxidized layer is positioned between layers of top p-DBRs.

11. The VCSEL according to claim 9, wherein the oxide VCSEL operates at a current of 10 to 40 mA.

12. The VCSEL according to claim 9, wherein the top electrode is a multilayer electrode of a ring shape including a Pt layer.

13. The VCSEL according to claim 9, further comprising an anti-reflection layer on a top of the current spreading layer.

14. A method of manufacturing an oxide VCSEL having a peak wavelength of 860±10 nm, wherein a GaP layer having a thickness of 1 μm or larger and a rough top surface is positioned between a top electrode and a top DBR.

* * * * *